(12) United States Patent
Tang et al.

(10) Patent No.: US 11,029,611 B2
(45) Date of Patent: Jun. 8, 2021

(54) DEVICE AND METHOD FOR DETECTING PROJECTION OBJECTIVE WAVE-FRONT ABERRATION

(71) Applicant: Shanghai Institute of Optics And Fine Mechanics, Chinese Academy of Sciences, Shanghai (CN)

(72) Inventors: Feng Tang, Shanghai (CN); Changzhe Peng, Shanghai (CN); Xiangzhao Wang, Shanghai (CN); Yunjun Lu, Shanghai (CN); Peng Li, Shanghai (CN)

(73) Assignee: Shanghai Institute of Optics And Fine Mechanics, Chinese Academy of Sciences, Shanghai (CN)

( * ) Notice: Subject to any disclaimer, the term of this patent is extended or adjusted under 35 U.S.C. 154(b) by 0 days.

(21) Appl. No.: 16/689,023

(22) Filed: Nov. 19, 2019

(65) Prior Publication Data
US 2021/0026250 A1    Jan. 28, 2021

(30) Foreign Application Priority Data
Jul. 23, 2019  (CN) .......................... 201910664574.1

(51) Int. Cl.
*G03F 7/20*    (2006.01)
*G01J 9/02*    (2006.01)

(52) U.S. Cl.
CPC ............ *G03F 7/706* (2013.01); *G01J 9/0215* (2013.01)

(58) Field of Classification Search
CPC .................................. G03F 7/706; G01J 9/0215
See application file for complete search history.

(56) References Cited

U.S. PATENT DOCUMENTS 6,650,399 B2 * 11/2003 Baselmans ......... G01M 11/0264
355/53
6,867,846 B2   3/2005 Poultney
(Continued)

FOREIGN PATENT DOCUMENTS

CN    102768471 A    11/2012
CN    102081308 B     2/2014
CN    108955905 A    12/2018

OTHER PUBLICATIONS

J. Braat et al., "Improved Ronchi test with extended source," Journal of the Optical Society of America A., vol. 16, No. 1, pp. 131-140 (1999).

(Continued)

*Primary Examiner* — Dominic J Bologna
(74) *Attorney, Agent, or Firm* — Mei & Mark LLP; Manni Li

(57) ABSTRACT

Projection objective wave-front aberration detecting device and a detecting method thereof, wherein the projection objective wave-front aberration detecting device comprises a light source and illuminating system, an object plane grating, an object plane displacement stage, a measured projection objective, an image plane grating, a two-dimensional photoelectric sensor, an image plane displacement stage and a control processing unit. According to the invention, by controlling the length of the object plane grating line, or the periodic structure of the object plane grating perpendicular to the shearing diffraction direction, or the object plane grating to adopt a sinusoidal grating, or the image plane grating to adopt an amplitude-phase hybrid grating, the complexity of an interference field is reduced, and the wave-front aberration detection speed and precision are improved, and the precision and speed of in-situ wave-front aberration detection can be improved.

8 Claims, 7 Drawing Sheets

(56) References Cited

U.S. PATENT DOCUMENTS

| | | | | |
|---|---|---|---|---|
| 7,088,458 | B1* | 8/2006 | Wegmann | G01J 9/02 |
| | | | | 356/124 |
| 7,333,216 | B2* | 2/2008 | Wegmann | G01J 9/02 |
| | | | | 356/124 |
| 7,336,371 | B1* | 2/2008 | Haidner | G01M 11/0271 |
| | | | | 356/515 |
| 7,417,745 | B2* | 8/2008 | Haidner | G01J 9/04 |
| | | | | 356/515 |
| 2005/0200940 | A1* | 9/2005 | Emer | G03F 7/706 |
| | | | | 359/299 |
| 2005/0243328 | A1* | 11/2005 | Wegmann | G03F 7/2041 |
| | | | | 356/520 |
| 2006/0001861 | A1* | 1/2006 | Wegmann | G03F 7/706 |
| | | | | 356/124 |
| 2010/0302523 | A1* | 12/2010 | Shiraishi | G03F 7/706 |
| | | | | 355/67 |
| 2017/0131176 | A1* | 5/2017 | Dai | G03F 7/706 |
| 2018/0087891 | A1* | 3/2018 | Wegmann | G01B 11/24 |
| 2020/0003655 | A1* | 1/2020 | Ehrmann | G02B 27/0025 |

OTHER PUBLICATIONS

Li Pingping, et al., "New Method of Sinusoidal Grating Generation Based on Area Encoding," Optics & Optoelectronic Technology, 9(01):36-41 (2011).

"Optical Shop Testing," Edited by Daniel Malacara and Published by John Wiley & Sons, Wiley Series in Pure and Applied Optics.

Primot J, Guérineau N., "Extended Hartmann test based on the pseudoguiding property of a Hartmann mask completed by a phase chessboard," [J]. Applied optics, 39(31): 5715-5720(2000).

Ling T., et al., "Quadriwave lateral shearing interferometer based on a randomly encoded hybrid grating," [J]. Optics letters, 40(10): 2245-2248 (2015).

\* cited by examiner

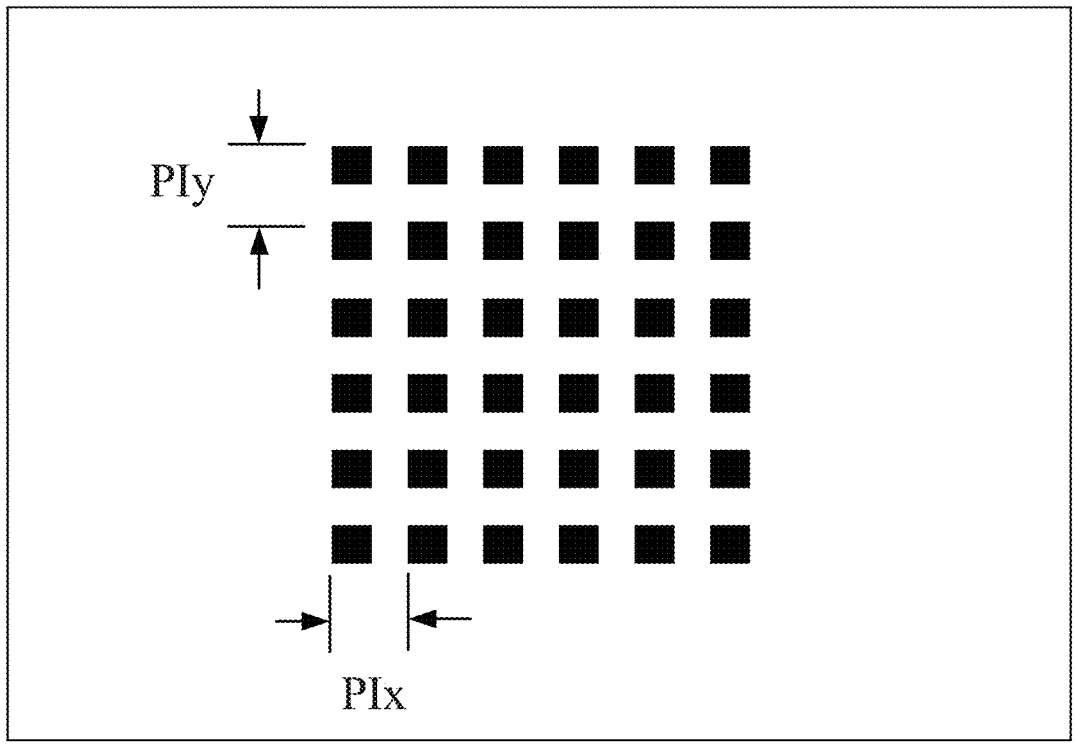
FIG. 7
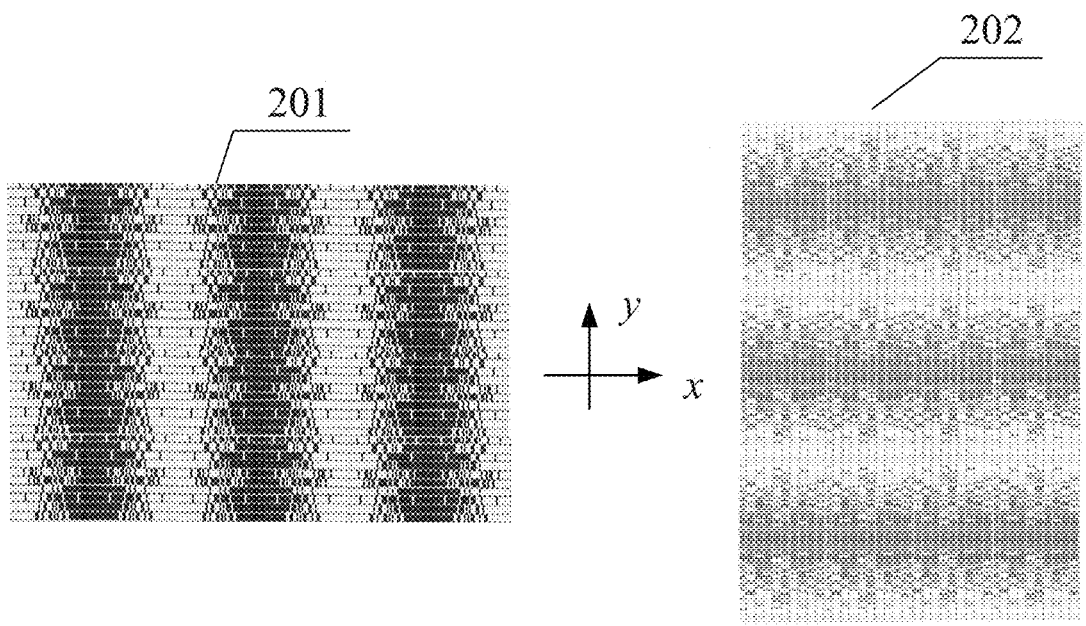
FIG. 8A
FIG. 8B

DEVICE AND METHOD FOR DETECTING PROJECTION OBJECTIVE WAVE-FRONT ABERRATION

CROSS-REFERENCE TO RELATED APPLICATION

The subject application claims priority on Chinese patent application no. 201910664574.1 filed on Jul. 23, 2019 in China. The contents and subject matter of the Chinese priority application is incorporated herein by reference.

FIELD OF THE INVENTION

The present invention relates to optical measurement and lithography tool, in particular, device and method for detecting the wave-front aberration of a projection objective.

BACKGROUND OF THE INVENTION

The Ronchi grating shearing interferometer has advantages of common optical path, no spatial optical path difference, no need of a separate ideal reference wave surface, high precision, high sensitivity, and simple structure. The device is used as an effective way to measure wave-front aberration of an optical system. In particular, for a high-end projection lithography tool, the shearing interferometer is one of the main technical schemes for in-situ and off-line detection of wave-front aberration of a projection objective of the high-end projection lithography tool.

Unlike ordinary interference between two beams of light, multi-level high-order diffracted light exists in an interference field of the Ronchi shearing interferometer due to the diffraction of image plane grating, in which the multi-level diffracted light can interfere with each other. By adopting spatial incoherent illumination and modulating the coherence of a light source by object plane grating, the interference between the high-order diffracted light can be inhibited so that the interference field is simplified and wave-front aberration detection is possible.

Braat, J. et al., "Improved Ronchi test with extended source," Journal of the Optical Society of America, A Vol. 16, No. 1, pp: 131-140 (1999) discloses a grating shearing interferometer modified with extended source. A one-dimensional grating with a duty ratio of 1:1 is adopted on an object plane of the optical system to be measured, where a one-dimensional quasi-cosine grating is adopted on the image plane to suppress high-order diffraction so that only ±1 order diffracted light and 0 order light interference are adopted for phase extraction. Because shearing interference requires at least two shearing wavefronts in the orthogonal shear direction to reconstruct the original wavefront, the object-image plane grating needs to be switched when the scheme is adopted.

U.S. Pat. No. 7,333,216 discloses shearing interference similar to Braat, J. et al. for wave-front aberration detection of projection objective of lithography tool. A two-dimensional grating used for the object plane is proposed and a multi-channel wave-front aberration detection scheme is disclosed.

U.S. Pat. No. 6,650,399 discloses that a two-dimensional grating can be used for object plane, but that makes it necessary to add a scanning process in another direction during the phase shift process in one shear direction, complicating the measurement process and making the measurement process sensitive to the energy stability of pulsed light source. Therefore, the object plane adopts a one-dimensional grating in two directions, and the image plane adopts a slit in two directions.

U.S. Pat. No. 7,417,745 discloses a phase shift algorithm of the above-mentioned technology, where a one-dimensional grating is adopted for an object plane and a two-dimensional grating is adopted for an image plane, and the grating period of the object plane is matched with the grating period of the image plane based on the amplification factor of a measured projection objective; and the image plane adopts a two-dimensional grating so that the image plane grating may not be switched in the measurement process.

U.S. Pat. No. 6,867,846 discloses similar technology to EUV lithography projection objective wave-front aberration detection. The patent discloses that two orthogonal one-dimensional gratings are adopted for an object plane, and a chessboard grating is adopted for an image plane. The period of the object plane grating multiplied by the amplification factor of the measured projection objective equals the period of the image plane grating, or the period of the object plane grating multiplied by 2 and then multiplied by the amplification factor of the measured projection objective equals the period of the image plane grating. The duty ratio of the object plane grating is 1:1. When the period of the object plane grating is matched with the period of the image plane grating based on the amplification factor of the measured projection objective, the 0 order diffraction of the image plane grating interferes with the ±1 order diffraction, respectively, and the ±1 order diffracted light does not interfere with each other. When twice the period of the object plane grating is matched with the period of the image plane grating based on the amplification factor of the measured projection objective, the ±1 order diffracted light of the image plane grating interferes with each other, and the 0 order diffracted light does not interfere with the ±1 order diffracted light; and interference signal processing is thereby simplified.

Chinese Patent Nos. 102081308B and CN 102768471A modify the grating structure of an object plane and image plane, and the object plane and image plane are both marked with one-dimensional grating, and the period of the image plane grating mark is matched with the period of the object plane grating mark on the basis of the amplification factor of the measured projection objective, that is, the period of the image plane grating mark is M times of the period of the object plane grating mark wherein M is the amplification factor of the measured projection objective.

It can be seen that in the above-mentioned references, for the convenience of implementation, the object plane adopts a one-dimensional grating and in most circumstances, the image plane adopts a two-dimensional grating to avoid the switching of the image plane grating. The spatial coherence of the light source is modulated through the object plane grating, and the interference field is simplified. According to the references, when the object plane grating adopts a one-dimensional grating, interference does not occur between multi-level diffractions of the image plane two-dimensional grating in a line direction parallel to the object plane grating, and interference only exists between diffraction orders perpendicular to the line direction of the grating. Theoretically, the assumption is completely true only when the length of the grating line is infinitely great. Due to the finite length of the grating line, the degree of coherence of diffraction of all orders parallel to the direction of the grating line cannot be completely zero, resulting in interference noise.

In addition, the object plane grating of the prior art adopts a common amplitude grating. It is easy to process, but the degree of freedom for adjusting and controlling the diffraction of the grating is limited to a certain extent. The modulation of the spatial coherence of a light source is reflected in the Fourier transform of the amplitude distribution of the light source, and as the object plane grating of the prior art still has multi-level diffraction, the 0 order of the image plane grating can interfere with multiple high-order diffraction orders respectively or other multiple sets of diffraction orders respectively. The interference field is still relatively complex, and 16-step, 32-step and even 64-step phase shifting techniques are needed to achieve accurate shear phase extraction, so that the measurement speed is reduced and the detection precision is influenced.

According to the references, most image plane gratings adopt amplitude or phase chessboard gratings such that high-order diffraction orders are not inhibited, the interference field is complex, the measurement speed is reduced, and the detection precision is influenced.

SUMMARY OF THE INVENTION

The present invention overcomes the defects of the references and provides a projection objective wave-front aberration detecting device and a detecting method thereof. In the present invention, by controlling the length of an object plane grating line, or the periodic structure of the object plane grating perpendicular to the shearing diffraction direction, or the object plane grating to adopt a sinusoidal grating, or an image plane grating to adopt an amplitude-phase hybrid grating, the complexity of an interference field is reduced, and the wave-front aberration detection speed and precision are improved, and the precision and speed of in-situ wave-front aberration detection can be improved.

To achieve the above object, the technical solution of the present invention is as follows.

A projection objective wave-front aberration detecting device comprising a light source and illuminating system, an object plane grating, an object plane displacement stage, a measured projection objective, an image plane grating, a two-dimensional photoelectric sensor, an image plane displacement stage, and a control processing unit;

the object plane grating is carried by the object plane displacement stage, and the image plane grating and the two-dimensional photoelectric sensor are carried by the image plane displacement stage;

the object plane grating, the measured projection objective, the image plane grating and the two-dimensional photoelectric sensor are sequentially arranged along the direction of spatial incoherent light output by the light source and illuminating system, wherein the object plane grating is located in an object field of the measured projection objective and uniformly illuminated by the light source and illuminating system, and the illumination numerical aperture fills the object numerical aperture range of the measured projection objective;

the image plane grating is located in the image-side field of the measured projection objective, and the object plane grating is imaged on the image plane grating;

the two-dimensional photoelectric sensor receives interference fringes generated by multi-level diffracted light of the image plane grating, and the receiving range comprises the image-side numerical aperture of the measured projection objective;

the control and processing unit is respectively connected with and controls the work of the control object plane displacement stage, the image plane displacement stage and the two-dimensional photoelectric sensor;

the object plane grating comprises a pair of gratings with shearing diffraction directions in an X direction and a Y direction respectively, and diffraction orders of non-zero even-order are missing in the shearing diffraction direction; when the object plane grating is adopted in the shearing diffraction direction, the shearing direction of the shearing interference is generated by diffracted light of the image plane grating; the image plane grating is a two-dimensional grating with non-zero even-order diffraction orders missing and simultaneously it generates diffracted light in the X direction and the Y direction;

the period of the object plane grating in the shearing diffraction direction thereof multiplied by the amplification factor of the measured projection objective in the shearing diffraction direction thereof equals the period of the image plane grating in the diffraction direction;

or the period of the object plane grating in the shearing diffraction direction thereof multiplied by 2, and then multiplied by the amplification factor of the measured projection objective in the shearing diffraction direction thereof equals the period of the image plane grating in the diffraction direction;

and the amplification factor of the measured projection objective in the X or Y direction refers to the length of an image, formed by an imaging object on the image plane, along the X or Y direction divided by the length of the imaging object on the object plane along the corresponding direction.

In the present invention, the object plane grating comprises a pair of gratings with shearing diffraction directions in an X direction and a Y direction respectively, wherein the gratings are one-dimensional, and the length of grating lines of the gratings equals the period of the image plane grating in the Y direction or the X direction divided by an amplification factor of the measured projection objective in the Y direction or the X direction and then multiplied by a positive integer;

and the object plane grating comprises a pair of gratings with shearing diffraction directions in the X direction and the Y direction respectively, wherein the gratings are two-dimensional;

the duty ratio thereof at a grating in a direction perpendicular to a shear direction is 1:1;

the grating period in a direction perpendicular to the shear direction equals the period of the image plane grating in the direction divided by an amplification factor of the measured projection objective in the direction, and then multiplied by 2N, wherein N is a positive integer;

or the grating period in a direction perpendicular to the shear direction equals the period of the image plane grating in the direction divided by an amplification factor of the measured projection objective in the direction, and then multiplied by 1/(4N), wherein the number of periods is greater than or equal to 8N, and N is a positive integer.

The working principle of the features of the projection objective wave-front aberration detecting device of the present invention is that the spatial coherence of the image plane grating between different diffraction orders perpendicular to the shearing diffraction direction of the object plane grating can be 0 by adopting the object plane grating form, so that the interference noise is reduced.

In the present invention, the image plane grating is an amplitude two-dimensional chessboard grating or an orthogonal grating, and diffraction orders of 0, ±1 and +/−3 and the like exist;

the object plane grating is an amplitude binarized area-encoding sinusoidal grating in the shearing diffraction direction;

the period of the object plane grating in the shearing diffraction direction multiplied by the amplification factor of the measured projection objective in the shearing diffraction direction thereof equals the period of the image plane grating in the diffraction direction;

and the amplitude binarized area-encoding sinusoidal grating approximately produces diffraction orders of 0 and ±1 only, and other diffraction orders are suppressed.

In the present invention, the image plane grating is a two-dimensional amplitude-phase hybrid grating for suppressing diffraction orders other than ±1 order diffraction order;

the object plane grating is an amplitude binarized area-encoding sinusoidal grating in the shearing diffraction direction or an amplitude grating with a duty ratio of 1:1;

and the period of the object plane grating in the shearing diffraction direction multiplied by 2, and then multiplied by the amplification factor of the measured projection objective in the shearing diffraction direction thereof equals the period of the image plane grating in the diffraction direction.

In the present invention, the object plane grating is a transmissive grating or a reflective grating.

In the present invention, the object plane grating comprises a plurality of pairs of gratings with shearing diffraction directions in an X direction and a Y direction respectively, wherein the gratings are positioned at different field-of-view point positions of a measured projection objective, and imaged to a plurality of sets of image plane gratings to generate a plurality of discrete interference information corresponding to the plurality of field-of-view points which is received by the two-dimensional photoelectric sensor, and simultaneously wave-front aberration at different field-of-view point positions are measured.

In the present invention, the object plane grating comprises a plurality of pairs of gratings with different periods in the shearing diffraction direction, and the image plane grating comprises a plurality of two-dimensional gratings with periods respectively matched with different periods of the object plane grating in the shearing diffraction direction so as to realize wave-front aberration detection with different shearing rates.

In the present invention, the measured projection objective is a transmissive objective or a reflective objective.

The present invention further provides a method for detecting wave-front aberration of a measured projection objective by adopting the projection objective wave-front aberration detecting device, the method comprising the following steps of:

(1) moving the object plane displacement stage, and moving a grating with a shearing diffraction direction X in the object plane grating to field-of-view point positions to be measured of the measured projection objective; moving the image plane displacement stage to enable the object plane grating to be imaged onto the image plane grating; and forming interference fringes and an interferogram being received by the two-dimensional photoelectric sensor;

(2) moving the object plane displacement stage or the image plane displacement stage along the X direction to obtain a phase shift interferogram, and calculating according to the prior art to obtain an X direction shearing phase;

(3) moving the object plane displacement stage, switching the object plane grating into a grating with a shearing diffraction direction in the Y direction, and the two-dimensional photoelectric sensor receiving an interferogram;

(4) moving the object plane displacement stage or the image plane displacement stage along the Y direction to obtain a phase shift interferogram, and calculating according to the prior art to obtain a Y direction shearing phase; and (5) performing shearing interference wavefront reconstruction by adopting shearing phases in the X direction and the Y direction to obtain a wave-front aberration of the measured projection objective at a field-of-view point.

The amplitude binarized area-encoding sinusoidal grating is illustrated (see Li Pingping, et al., "New Method of Sinusoidal Grating Generation Based on Area Encoding," Optics & Optoelectronic Technology, 9(01):36-41 (2001)), therefore, in the diffraction orders of the image plane grating, interference only occurs to 0 order and +1 order, 0 order and −1 order, and no other interference signals exist; and in the case of small shearing, the interference signals of 0 order and +1 order, 0 order and −1 order are the same, namely only one interference signal exists in an interference field without other interference noise; therefore, a classical phase shift interference technology can be adopted to carry out shearing phase extraction, wherein the technology is simple and the measuring speed is fast; and the classical phase shift interference technology (see "Optical Shop Testing," Edited by Daniel Malacara and Published by John Wiley & Sons, Wiley Series in Pure and Applied Optics) is illustrated.

The two-dimensional amplitude-phase hybrid grating is disclosed in (see Primot J, Guérineau N., "Extended Hartmann test based on the pseudoguiding property of a Hartmann mask completed by a phase chessboard," [J]. Applied optics, 39(31): 5715-5720(2000); Ling T., et al., "Quadriwave lateral shearing interferometer based on a randomly encoded hybrid grating," [J]. Optics letters, 40(10): 2245-2248 (2015); and Chinese Patent No. 201810247425.0); the two-dimensional amplitude-phase hybrid grating suppresses diffraction orders other than ±1 order diffraction order, so that the interference field only has interference between the +1 order and the −1 order of the image plane grating and no other interference signals exist, and the two-dimensional amplitude-phase hybrid grating can be suitable for the condition of large shearing quantity; only one interference signal exists in the interference field and no other interference noise exists; the shearing phase can be extracted by adopting a classical phase shift interference technology, which is simple and has fast measuring speed; and since no other diffraction orders exist in the interference field, the interference contrast is increased.

The present invention has the technical effects that:

(1) by optimizing the length of an object plane grating line or a grating structure perpendicular to the shearing diffraction direction, the present invention enables the spatial coherence of the image plane grating between different diffraction orders perpendicular to the shearing diffraction direction of the object plane grating to be 0 so that the noise in the interference field is reduced and the detection precision is improved;

(2) by adopting sinusoidal grating on the object plane, the interference field only has 0 order and +1 order interference, and 0 order and −1 order interference, so that the projection objective wave-front aberration detecting device can adopt the classical phase shift interference technology, and the complexity of phase extraction is reduced, and the detection speed and precision of wave-front aberration detection are improved;

(3) the image plane grating adopts a two-dimensional amplitude-phase hybrid grating for suppressing diffraction orders other than ±1 order diffraction order, so that the interference field only has interference between the +1-order and the −1 order, and complexity of the interference field is reduced, and detection speed and precision are improved; and (4) when the projection objective wave-front aberration detecting device is adopted as the in-situ wave-front aberration detection system by a projection lithography machine, the in-situ wave-front aberration detection precision and speed can be improved, and the influence of the in-situ wave-front aberration detection on the yield can be reduced.

BRIEF DESCRIPTION OF THE DRAWINGS

FIGS. 5A to 5D show are exemplary views showing the effect of the form of the object plane grating on the spatial coherence between different diffraction orders in the vertical direction of shear diffraction in the present invention, wherein FIG. 5A shows that the object plane grating is a one-dimensional grating and the length of a grating line is not equal to an integral multiple of the period of the object plane grating; FIG. 5B shows that the object plane grating is a one-dimensional grating and the length of the grating line is equal to an integral multiple of the period of the object plane grating; FIG. 5C shows that the object plane grating is a two-dimensional grating and the grating period of the object plane grating in the shearing vertical direction is equal to 2 times of the period in the shear direction; and FIG. 5D shows that the object plane grating is a two-dimensional grating, and the grating period of the object plane grating in the shearing vertical direction is equal to ⅛ of the period of the object plane grating, and the period number is 16.

FIG. 7 is a schematic drawing showing a second embodiment of the image plane grating of the present invention.

FIGS. 8A and 8B are schematic drawings showing a fourth embodiment of the object plane grating of the present invention, where FIG. 8A shows a grating having a shearing diffraction direction in X direction, and FIG. 8B shows a grating having a shearing diffraction direction in Y direction.

DETAILED DESCRIPTION OF THE INVENTION

For a better understanding of the object, technical schemes, and advantages of the present invention, the present invention is further described with reference to the following embodiments, taken in conjunction with the accompanying drawings, which should not be taken to limit the scope of the invention.

Figure 1:
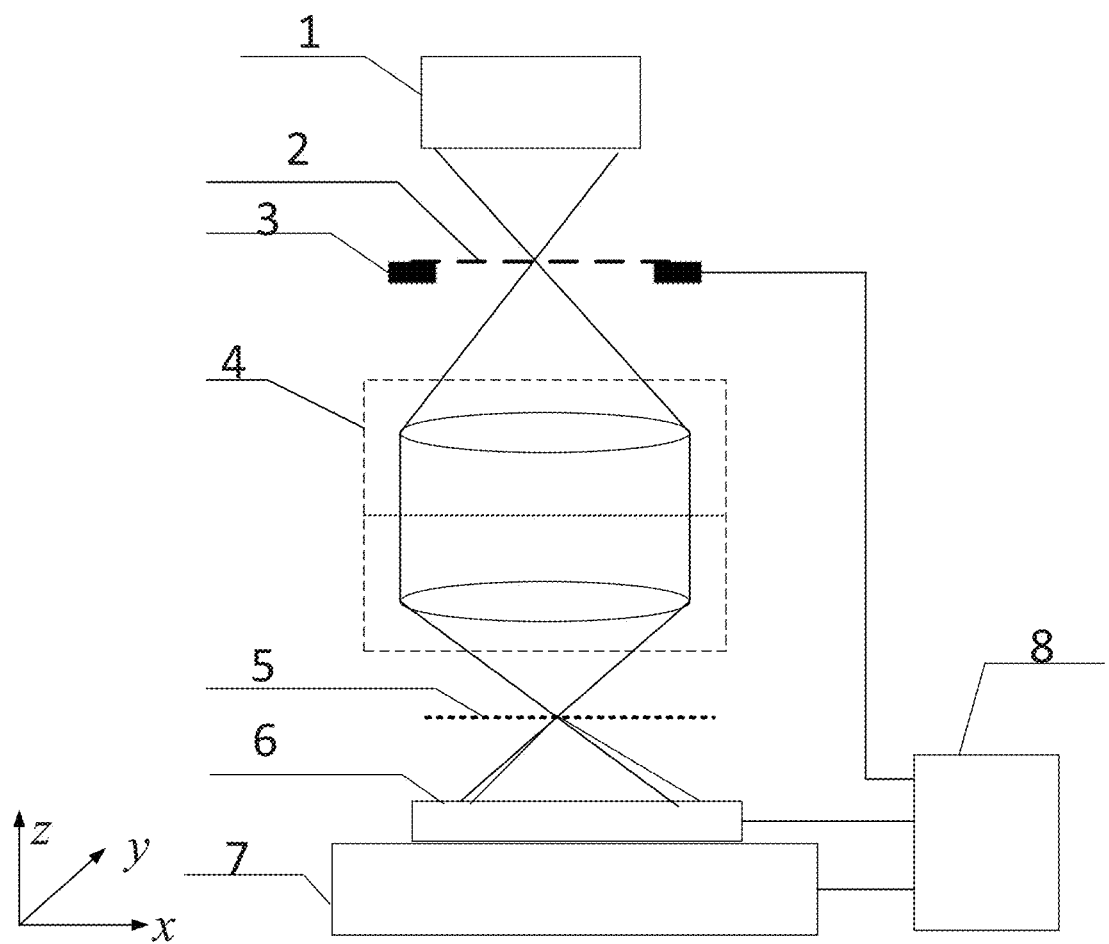
FIG. 1 is a schematic drawing showing the projection objective wave-front aberration detecting device of the present invention.
Figure 2:
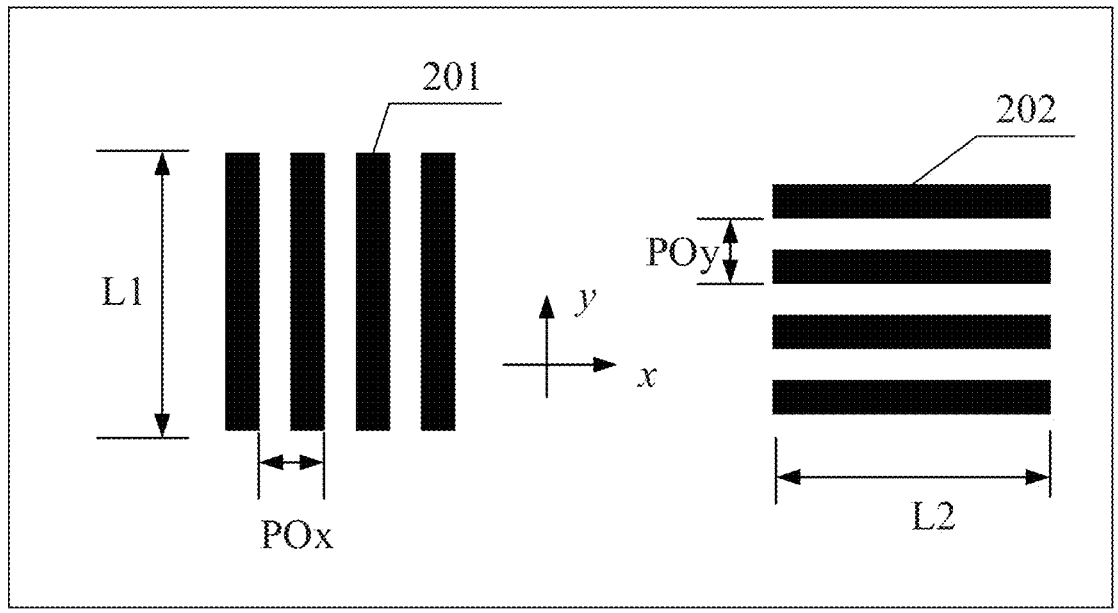
FIG. 2 is a schematic drawing showing a first embodiment of the object plane grating of the present invention.
Figure 3:
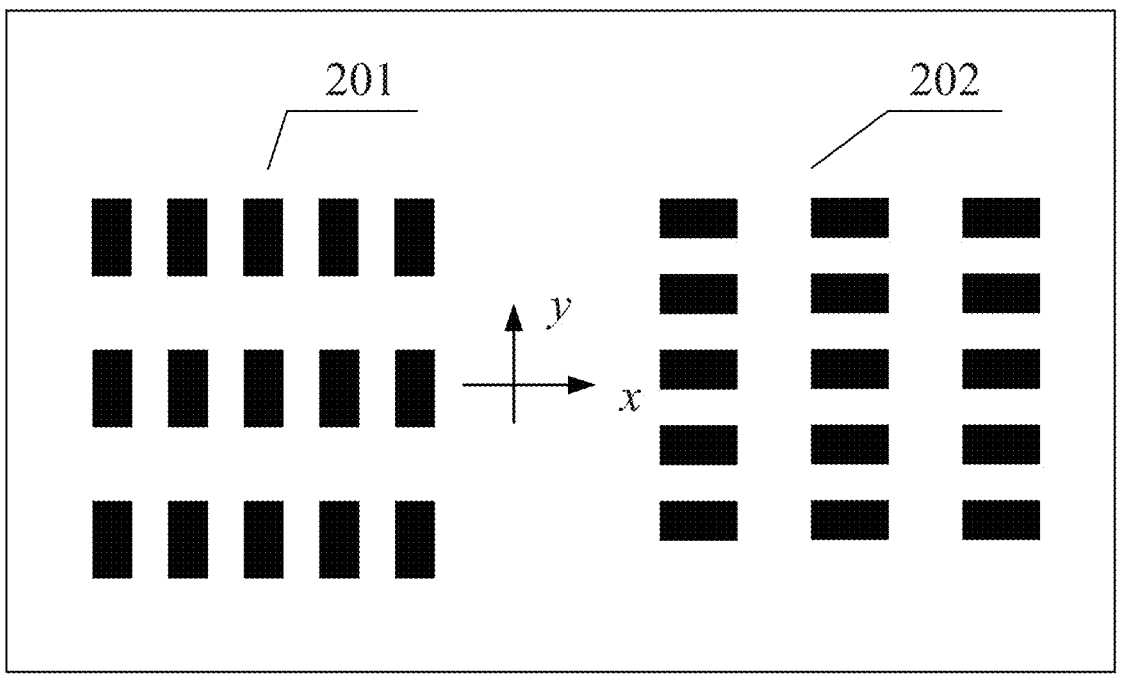
FIG. 3 is a schematic drawing showing a second embodiment of the object plane grating of the present invention.

As shown in FIG. 1, the projection objective wave-front aberration detecting device of the present invention comprises a light source and illuminating system 1, an object plane grating 2, an object plane displacement stage 3, a measured projection objective 4, an image plane grating 5, a two-dimensional photoelectric sensor 6, an image plane displacement stage 7 and a control processing unit 8; the light source and illuminating system 1 outputs spatially incoherent light. Wherein the object plane grating 2 is positioned in the object field of the measured projection objective 4 and uniformly illuminated by the light source and illuminating system 1, and the illuminating numerical aperture fills the object numerical aperture range of the measured projection objective 4; the object plane grating 2 is carried by the object plane displacement stage 3 and subjected to position adjustment; the image plane grating 5 is located in the image-side field of the measured projection objective 4, and the object plane grating 3 is imaged on the image plane grating 5; the two-dimensional photoelectric sensor 6 is positioned at the rear side of the image plane grating 5 along the light transmission direction to receive interference fringes generated by multi-level diffracted light of the image plane grating 5, wherein the receiving range comprises the image-side numerical aperture of the measured projection objective 4; the image plane grating 5 and the two-dimensional photoelectric sensor 6 are carried by the image plane displacement stage 7 and subjected to position adjustment; the control and processing unit 8 controls the work of the object plane displacement stage 3, the image plane displacement stage 7 and the two-dimensional photoelectric sensor 6, processes interference fringes, and obtains the wave-front aberration of the measured projection objective 4; the object plane grating 2 comprises a pair of gratings with shearing diffraction directions of an X direction and a Y direction respectively, and diffraction orders of non-zero even-orders are missing in the shearing diffraction direction; when the object plane grating is adopted in the shearing diffraction direction, shearing direction of shearing interference is generated by the diffraction light of the image plane grating; the image plane grating 5 is a two-dimensional grating with non-zero even-order diffraction orders missing and simultaneously it generates diffracted light in the X direction and Y direction; the period of the object plane grating 2 in the shearing diffraction direction thereof multiplied by the amplification factor of the measured projection objective 4 in the shearing diffraction direction thereof equals the period of the image plane grating 5 in the diffraction direction; or the period of the object plane grating 2 in the shearing diffraction direction thereof multiplied by 2, and then multiplied by the amplification factor of the measured projection objective 4 in the shearing diffraction direction thereof equals the period of the image plane grating 5 in the diffraction direction; the amplification factors of the measured projection objective 4 in the X or Y direction refers to the length of an image, formed by an imaging object on the image plane, along the X or Y direction divided by the length of the imaging object on the object plane along the corresponding direction; the working wavelength of the measured projection objective 4 is 193 nm, and the image-side numerical aperture is 0.75, and the amplification factor of the measured projection objective 4 in the X or Y direction is the same, being ¼; the period of the image plane grating 5 in the X direction and the Y direction is the same, being 10 μm; and the period of the object plane grating 2 is 40 μm or 20 μm;

As shown in FIG. 2, the first embodiment of an object plane grating 2 of the present invention comprises a grating 201 having a shearing diffraction direction in X direction and a grating 202 having a shearing diffraction direction in Y direction. Both the grating 201 and the grating 202 are one-dimensional gratings with a duty ratio of 1:1; the length of the grating line of the grating 201 is L1, and it equals the period of the image plane grating 5 in the Y direction divided by the amplification factor of the measured projection objective in the Y direction and then multiplied by a positive integer; the length of the grating line of the grating 202 is L2, and it equals the period of the image plane grating 5 in the X direction divided by the amplification factor of the measured projection objective in the X direction and then multiplied by a positive integer; and in this embodiment, L1=L2=200 µm;

As shown in FIG. 3, the second embodiment of an object plane grating 2 of the present invention comprises a grating 201 having a shearing diffraction direction in X direction and a grating 202 having a shearing diffraction direction in Y direction. The grating 201 and the grating 202 are two-dimensional gratings; the grating duty ratio of the grating 201 and the grating 202 in the X direction and the Y direction are both 1:1; and the grating period of the grating 201 in the Y direction is equal to 80 µm and the grating period of the grating 202 in the X direction is equal to 80 µm.

Figure 4:
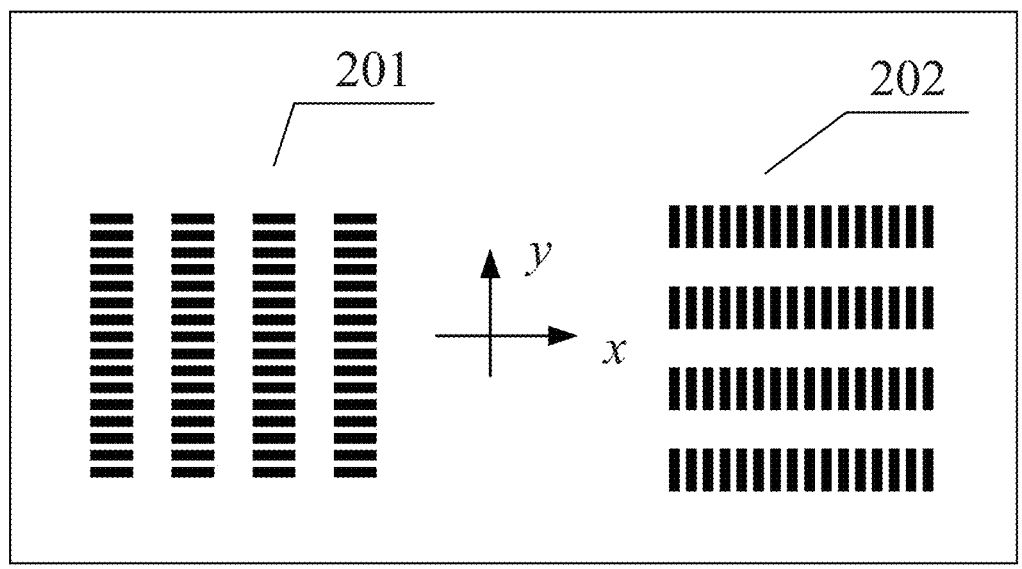
FIG. 4 is a schematic drawing showing a third embodiment of the object plane grating of the present invention.

As shown in FIG. 4, the third embodiment of an object plane grating of the present invention comprises a grating 201 having a shearing diffraction direction in X direction and a grating 202 having a shearing diffraction direction in Y direction. The duty ratio of the grating 201 and the grating 202 is 1:1; the grating period of the grating 201 in the Y direction is equal to 5 µm, and the period number is no less than 16; and the grating period of the grating 202 in the X direction is equal to 5 µm, and the period number is no less than 16.

Figure 5A:
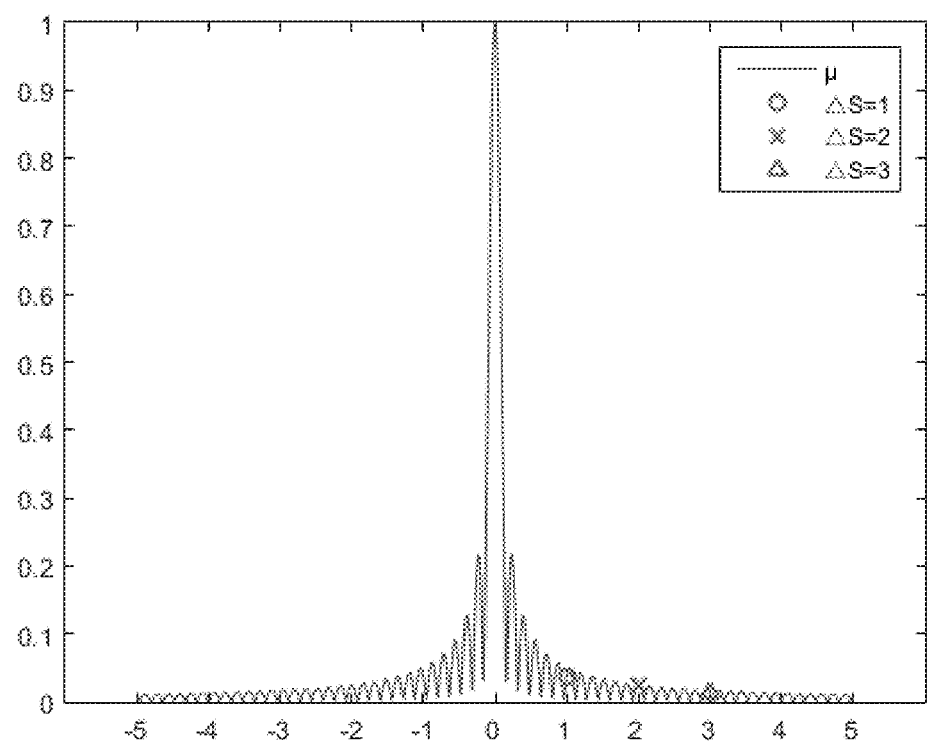
Figure 5B:
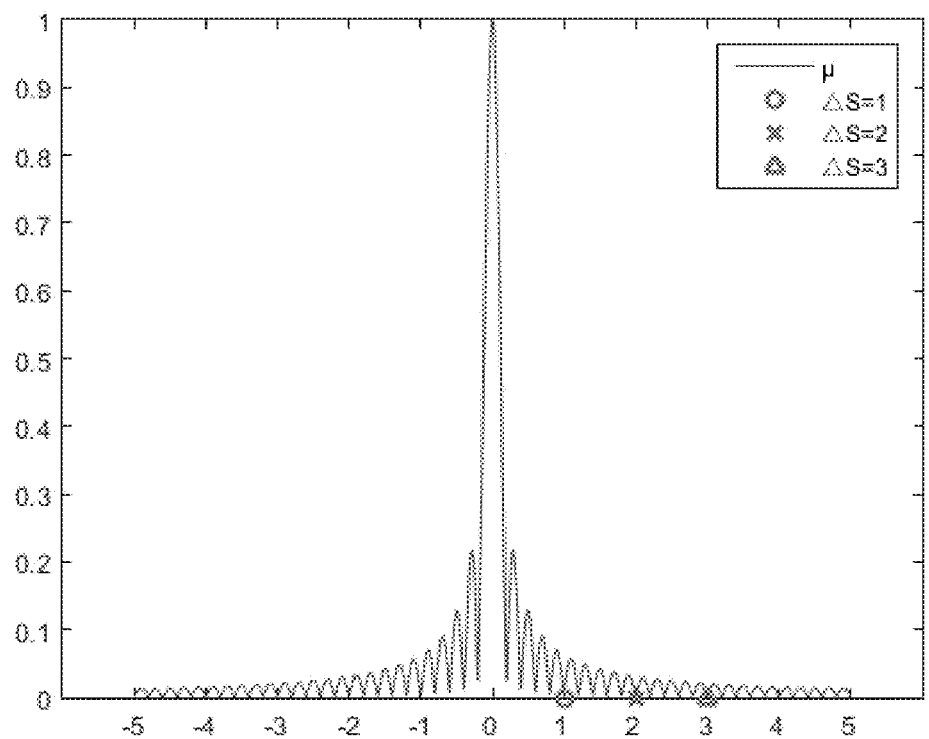
Figure 5C:
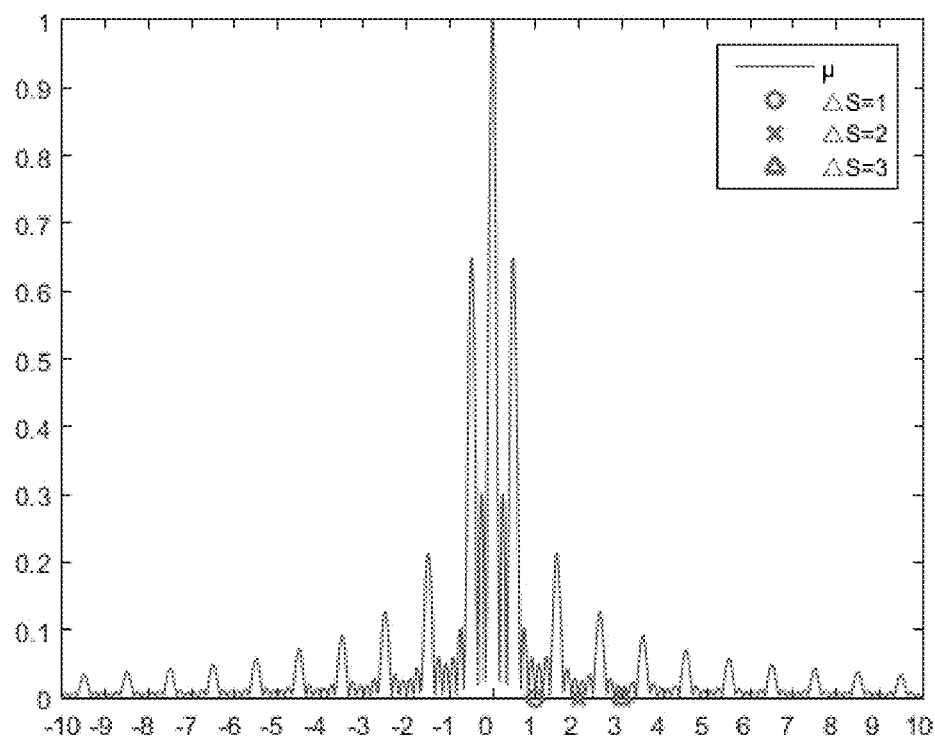
Figure 5D:
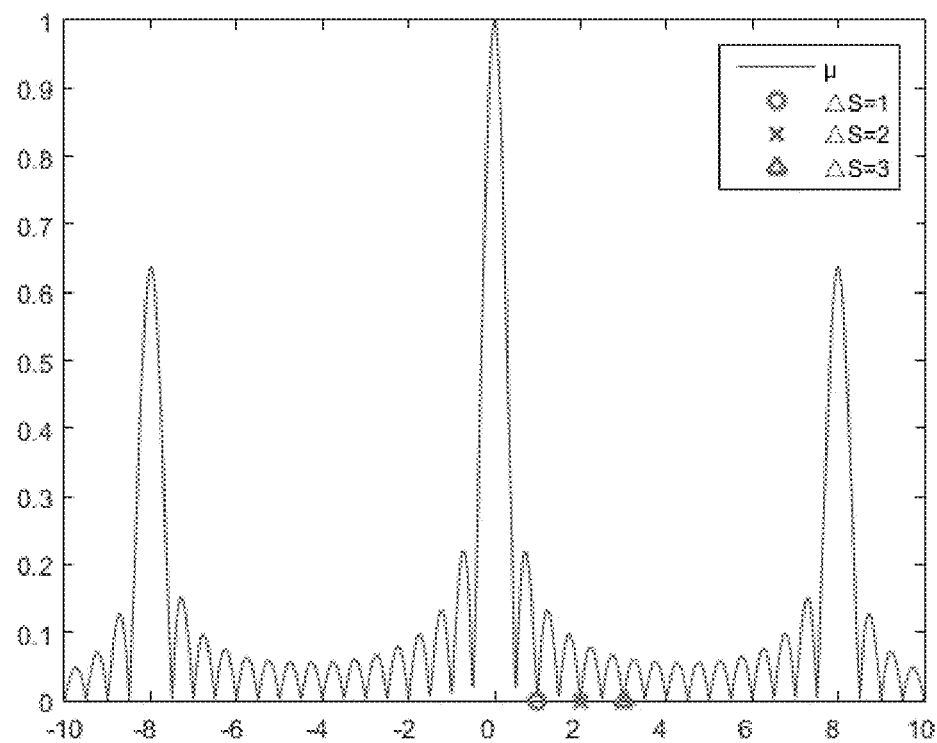

FIGS. 5A to 5D are exemplary views showing the effect of the form of an object plane grating on the spatial coherence in the vertical direction of the shear diffraction. FIG. 5A shows that the length of the grating line is 250 µm, wherein the length is not an integral multiple of the period of the object plane grating and the spatial coherence of the image plane grating between different diffraction orders perpendicular to the shearing diffraction direction of the object plane grating is not zero; FIG. 5B shows that the grating line has a length of 200 µm, wherein the length is an integral multiple of the period of the object plane grating, and the spatial coherence of the image plane grating between different diffraction orders perpendicular to the shearing diffraction direction of the object plane grating is 0; FIG. 5C corresponds to the embodiment of the object plane grating of FIG. 3, and FIG. 5D corresponds to the embodiment of the object plane grating of FIG. 4, wherein the spatial coherence of the image plane grating between different diffraction orders perpendicular to the shearing diffraction direction of the object plane grating is 0.

Figure 6:
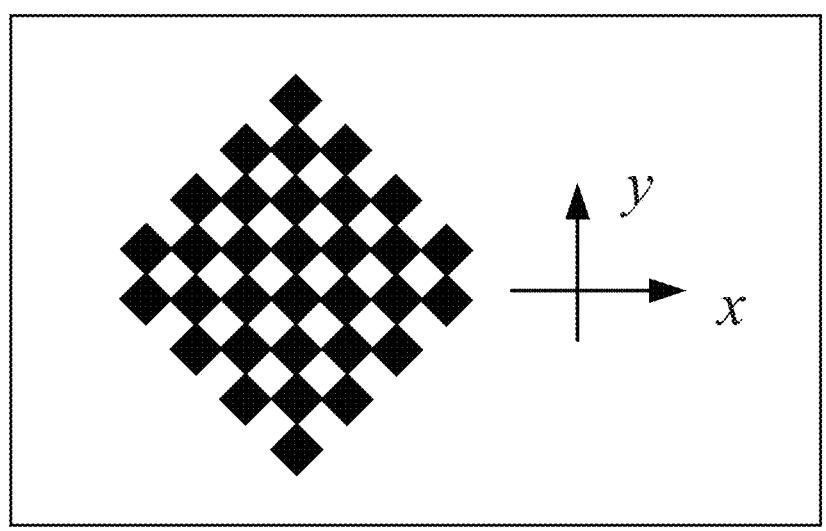
FIG. 6 is a schematic drawing showing a first embodiment of the image plane grating of the present invention.

As shown in FIG. 6, the first embodiment of the image plane grating 5 of the present invention is an amplitude two-dimensional chessboard grating and has diffraction orders of 0, ±1 and +3 and the like. As shown in FIG. 7, the second embodiment of the image plane grating 5 of the present invention is an amplitude orthogonal grating having diffraction orders of 0, ±1, ±3 and the like. The image plane grating embodiments as shown in FIGS. 6 and 7 each has a grating period of 10 µm.

Figure 9:
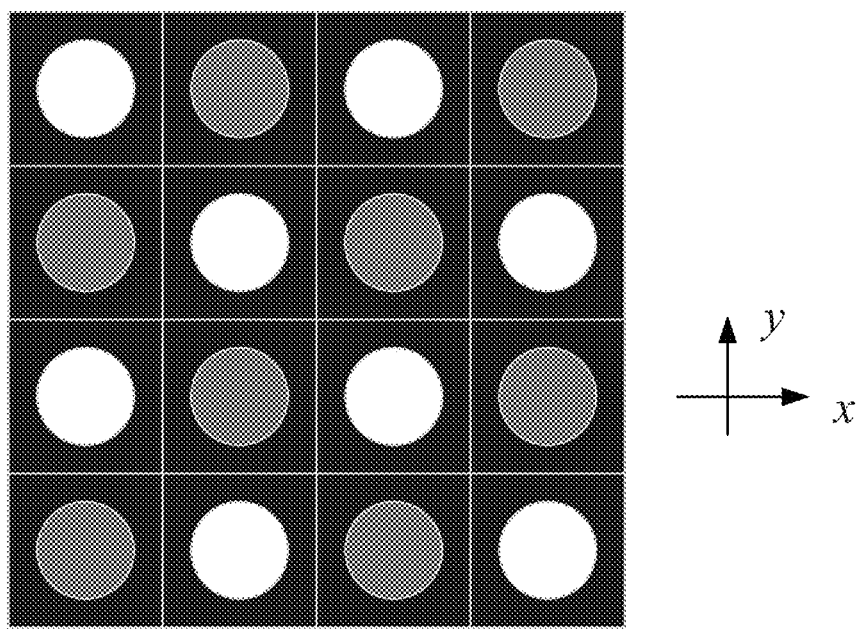
FIG. 9 is a schematic drawing showing a third embodiment of the image plane grating of the present invention.

As shown in FIGS. 8A and 8B, the fourth embodiment of an object plane grating 2 of the present invention is an amplitude binarized area-encoding sinusoidal grating in a shearing diffraction direction; FIG. 8A shows a grating 201 having a shearing diffraction direction in X direction, and FIG. 8B shows a grating 202 having a shearing diffraction direction in Y direction; the period of grating 201 in X direction and the period of grating 202 in Y direction are both 40 µm; the grating 201 and the grating 202 both only have diffraction orders of 0 and ±1, and other diffraction orders are suppressed; therefore, between the diffraction orders of image plane grating 5, interference only occurs to 0 order and +1 order, 0 order and −1 order, and no other interference signals exist; and under the condition of small shearing, the interference signals of 0 order and +1 order, 0 order and −1 order are the same, namely only one interference signal exists in an interference field and no other interference noise exists, so that the shearing phase can be extracted by adopting a classical phase shift interference technology, which is simple and has fast measuring speed;

As shown in FIG. 9, the third embodiment of an image plane grating 5 of the present invention is a two-dimensional amplitude-phase hybrid grating that suppresses diffraction orders other than ±1 order diffraction order, and has a grating period of 10 µm in both X and Y direction; the grating is disclosed in Chinese Patent Application No. 201810247425.0; the object plane grating 2 adopts an amplitude binarized area-encoding sinusoidal grating in the shearing diffraction direction or an amplitude grating with a duty ratio of 1:1; the period of the object plane grating in the shearing diffraction direction is 20 µm; the two-dimensional amplitude-phase hybrid grating suppresses diffraction orders other than ±1 order diffraction order, and the interference field only has interference between the +1 order and the −1 order of the image plane grating and no other interference signal exists, so that it can be suitable for the condition of large shearing quantity, and only one interference signal exists in the interference field and no other interference noise exists; the shearing phase can be extracted by adopting a classical phase shift interference technology, which is simple and has fast measuring speed; and since no other diffraction orders exist in the interference field, the interference contrast is increased;

In the present invention, the object plane grating 2 is a transmissive grating or a reflective grating.

In the present invention, the object plane grating 2 comprises a plurality of pairs of gratings with shearing diffraction directions in X direction and Y direction respectively, wherein the gratings are positioned at different field-of-view point positions of a measured projection objective 4, and imaged to a plurality of sets of image plane gratings to generate a plurality of discrete interference information corresponding to the plurality of field-of-view points which is received by the two-dimensional photoelectric sensor 6, and simultaneously wave-front aberration at different field-of-view point positions are measured.

In the present invention, the object plane grating 2 comprises a plurality of pairs of gratings with different periods in the shearing diffraction direction, and the image plane grating 5 comprises a plurality of two-dimensional gratings with periods respectively matched with the different periods of the object plane grating 2 in the shearing diffraction direction so as to realize wave-front aberration detection with different shearing rates for adjusting the measurement dynamic range and the measurement resolution.

Figure 10:
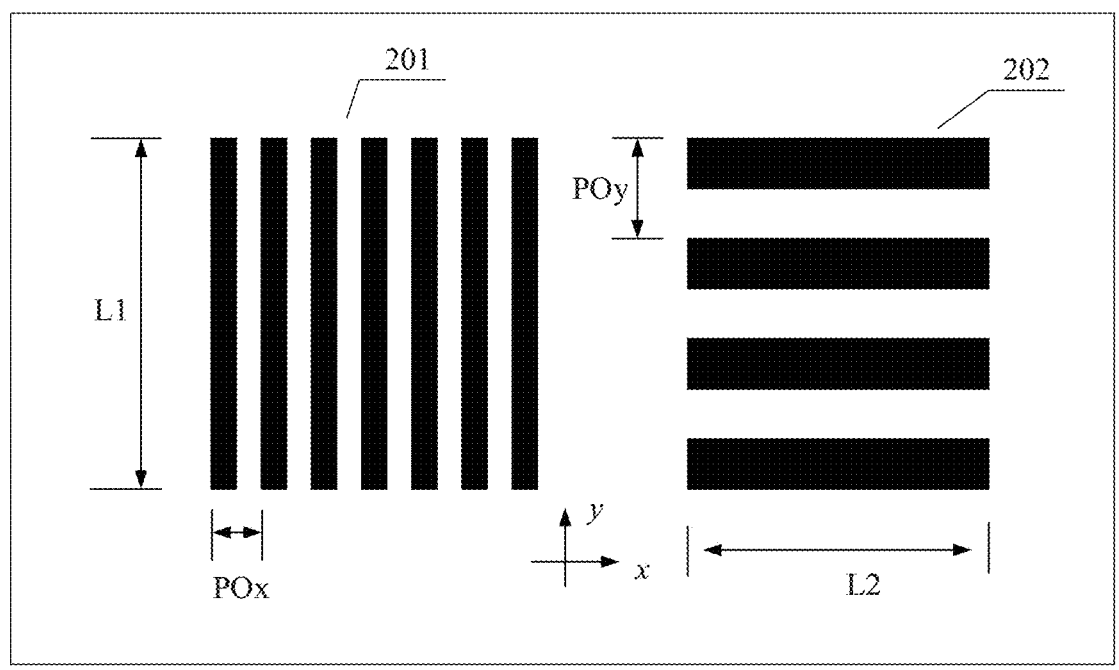
FIG. 10 is a schematic drawing showing a fifth embodiment of the object plane grating of the present invention.

The amplification factor of the measured projection objective 4 in X and Y directions may also be different. As shown in FIG. 10, the fifth embodiment of the object plane grating of the present invention is an embodiment of a grating 201 and grating 202 in an object plane grating 2 when the amplification factor of a projection objective 4 in the X direction is ¼ and the amplification factor in the Y direction is ⅛. The period of the grating 202 is twice the period of the grating 201, and at this time, the period of the image plane grating 5 in the X direction and the Y direction is the same.

In the present invention, the measured projection objective 4 is a transmissive objective or a reflective objective.

In the present invention, the method for detecting the wave-front aberration of the measured projection objective 4 by adopting the projection objective wave-front aberration detecting device is disclosed, characterized by comprising the following steps of:

(1) moving object plane displacement stage 3, and moving grating 201 with the shearing diffraction direction X in the object plane grating 2 to field-of-view point positions to be measured of the measured projection objective 4; moving image plane displacement stage 7 to enable the object plane grating 2 to be imaged onto the image plane grating 5; and forming interference fringes and an interferogram being received by two-dimensional photoelectric sensor 6;

(2) moving the object plane displacement stage 3 or the image plane displacement stage 7 along the X direction to obtain a phase shift interferogram, and calculating to obtain an X direction shearing phase;

(3) moving the object plane displacement stage 3, switching the object plane grating 2 into a grating 202 with the shearing diffraction direction in the Y direction, and the two-dimensional photoelectric sensor 6 receiving an interferogram;

(4) moving the object plane displacement stage 3 or the image plane displacement stage 7 along the Y direction to obtain a phase shift interferogram, and calculating to obtain a Y direction shearing phase; and (5) performing shearing interference wavefront reconstruction by adopting shearing phases in the X direction and the Y direction to obtain the wave-front aberration of the measured projection objective 4 at the field-of-view point.

The embodiments of the present invention have the following technical effects that:

(1) by optimizing the length of an object plane grating line or a grating structure perpendicular to the shearing diffraction direction, interference field noise is reduced, and detection precision is improved;

(2) by adopting sinusoidal grating on the object plane, the projection objective wave-front aberration detecting device can adopt the classical phase shift interference technology, so that the detection speed and precision are improved; and (3) by adopting the two-dimensional amplitude-phase hybrid grating in the image plane grating, the complexity of an interference field is reduced and the detection speed and precision are improved.

The projection objective wave-front aberration detecting device of the present invention is used as an in-situ wave-front aberration detection system for the projection photo-etching machine, making the detection speed faster and the accuracy higher, and reducing the influence of the in-situ wave-front aberration detection on the yield.

We claim:

1. A device for detecting projection objective wave-front aberration, comprising:

a light source and illuminating system (1), the light source and illuminating system (1) comprising a light source for outputting a spatial incoherent light with an illumination numerical aperture at a direction of the spatial incoherent light, an object plane grating (2), an object plane displacement stage (3), a measured projection objective (4), an image plane grating (5), a two-dimensional photoelectric sensor (6), an image plane displacement stage (7), and a control processing unit (8), wherein the object plane grating (2) is carried by the object plane displacement stage (3), and the image plane grating (5) and the two-dimensional photoelectric sensor (6) are carried by the image plane displacement stage (7);

the object plane grating (2), the measured projection objective (4), the image plane grating (5), and the two-dimensional photoelectric sensor (6) are sequentially arranged along the direction of the spatial incoherent light output by the light source and illuminating system (1), wherein the object plane grating (2) is located in an object field of the measured projection objective (4) and uniformly illuminated by the light source and illuminating system (1), and the illumination numerical aperture of the light source and illuminating system (1) fills the object numerical aperture range of the measured projection objective (4);

the image plane grating (5) is located in the image-side field of the measured projection objective (4), and the object plane grating (2) is imaged on the image plane grating (5);

the two-dimensional photoelectric sensor (6) receives interference fringes generated by multi-level diffracted light of the image plane grating (5), and the receiving range comprises the image-side numerical aperture of the measured projection objective (4);

and the control processing unit (8) is respectively connected with and controls the work of the object plane displacement stage (3), the image plane displacement stage (7) and the two-dimensional photoelectric sensor (6);

the object plane grating (2) is a one-dimensional grating or a two-dimensional grating, and the object plane grating (2) comprises a pair of gratings with shearing diffraction directions in an X direction and a Y direction respectively;

when the object plane grating (2) is one-dimensional, the length of grating lines of the gratings equals the period of the image plane grating (5) in the Y direction or the X direction divided by an amplification factor of the measured projection objective (4) in the Y direction or the X direction and then multiplied by a positive integer;

when the object plane grating (2) is two-dimensional, the duty ratio thereof at the grating in a direction perpendicular to the shear direction is 1:1; the grating period in the direction perpendicular to the shear direction equals the period of the image plane grating (5) in the direction divided by an amplification factor of the measured projection objective (4) in the direction, and then multiplied by 2N, wherein N is a positive integer; or the grating period in a direction perpendicular to the shear direction equals the period of the image plane grating (5) in the direction divided by an amplification factor of the measured projection objective (4) in the direction, and then multiplied by $1/(4N')$, the number of periods of the object plane grating (2) is greater than or equal to $8N'$, and $N'$ is a positive integer.

2. The device of claim 1, wherein the image plane grating (5) is an amplitude two-dimensional chessboard grating or an orthogonal grating, and has diffraction orders of $0, \pm 1, +3$;

the object plane grating (2) is an amplitude binarized area-encoding sinusoidal grating in a shearing diffraction direction;

the period of the object plane grating (2) in the shearing diffraction direction multiplied by the amplification factor of the measured projection objective (4) in the shearing diffraction direction thereof equals the period of the image plane grating (5) in the diffraction direction; and the amplitude binarized area-encoding sinusoidal grating approximately produces diffraction orders of 0 and ±1 only, and other diffraction orders are suppressed.

3. The device of claim 1, wherein the image plane grating (5) is a two-dimensional amplitude-phase hybrid grating that suppresses diffraction orders other than ±1 order diffraction order;

the object plane grating (2) is an amplitude binarized area-encoding sinusoidal grating in a shearing diffraction direction or an amplitude grating with a duty ratio of 1:1; and the period of the object plane grating (2) in the shearing diffraction direction multiplied by 2 and then multiplied by an amplification factor of the measured projection objective (4) in the shearing diffraction direction thereof equals the period of the image plane grating (5) in the diffraction direction.

4. The device of claim 1, wherein the object plane grating (2) is a transmissive grating or a reflective grating.

5. The device of claim 1, wherein the object plane grating (2) comprises a plurality of pairs of gratings with shearing diffraction directions in an X direction and a Y direction respectively, wherein the gratings are positioned at different field-of-view point positions of the measured projection objective (4) and imaged to the plurality of sets of image plane grating (5) to generate a plurality of discrete interference information corresponding to a plurality of field-of-view points which is received by the two-dimensional photoelectric sensor 6, and simultaneously wave-front aberration at different field-of-view point positions are measured.

6. The device of claim 1, wherein the object plane grating (2) comprises a plurality of pairs of gratings with different periods in a shearing diffraction direction, and the image plane grating (5) comprises a plurality of two-dimensional gratings with periods respectively matched with different periods of the object plane grating (2) in the shearing diffraction direction so as to realize wave-front aberration detection with different shearing rates.

7. The device of claim 1, wherein the measured projection objective (4) is a transmissive objective or a reflective objective.

8. A method for detecting a wave-front aberration of the measured projection objective (4) by adopting the projection objective wave-front aberration detecting device according claim 1, comprising:

moving the object plane displacement stage (3) and moving a grating (201) with a shearing diffraction direction X in the object plane grating (2) to field-of-view point positions to be measured of the measured projection objective (4);

moving the image plane displacement stage (7) to enable the object plane grating (2) to be imaged onto the image plane grating (5);

forming interference fringes and an interferogram being received by the two-dimensional photoelectric sensor (6);

moving the object plane displacement stage (3) or the image plane displacement stage (7) along the X direction to obtain a first group of phase shift interferograms and obtaining an X direction shearing phase based on the first group of phase shift interferograms;

moving the object plane displacement stage (3), switching the object plane grating (2) into a grating (202) with a shearing diffraction direction in the Y direction, and receiving an interferogram via the two-dimensional photoelectric sensor (6);

moving the object plane displacement stage (3) or the image plane displacement stage (7) along the Y direction to obtain a second group of phase shift interferograms and obtaining a Y direction shearing phase based on the second group of phase shift interferograms; and performing shearing interference wavefront reconstruction by adopting shearing phases in the X direction and the Y direction to obtain a wave-front aberration of the measured projection objective (4) at a field-of-view point.

\* \* \* \* \*